US012603618B2

(12) United States Patent
Wang

(10) Patent No.: US 12,603,618 B2
(45) Date of Patent: Apr. 14, 2026

(54) SIGNAL AMPLIFYING CIRCUIT AND SIGNAL PROCESSING SYSTEM AND ANALOG-TO-DIGITAL CONVERTING SYSTEM COMPRISING THE SAME

(71) Applicant: Realtek Semiconductor Corporation, Hsinchu (TW)

(72) Inventor: Chih-Chiang Wang, Hsinchu (TW)

(73) Assignee: Realtek Semiconductor Corporation, Hsinchu (TW)

( * ) Notice: Subject to any disclaimer, the term of this patent is extended or adjusted under 35 U.S.C. 154(b) by 485 days.

(21) Appl. No.: 18/187,657

(22) Filed: Mar. 21, 2023

(65) Prior Publication Data

US 2023/0327610 A1    Oct. 12, 2023

(30) Foreign Application Priority Data

Apr. 12, 2022    (TW) ................................... 111113928

(51) Int. Cl.
H03F 1/32 (2006.01)
H03M 1/12 (2006.01)
(52) U.S. Cl.
CPC ............ H03F 1/3217 (2013.01); H03M 1/12 (2013.01)
(58) Field of Classification Search
CPC .. H03F 1/3217; H03F 3/265; H03F 2200/129; H03F 2200/171; H03F 3/45659; H03F 3/45183; H03F 3/45663; H03F 2203/45031; H03F 2203/45051; H03M 1/12; H03M 3/424; H03M 3/452; H03M 3/458

USPC ................................................. 330/252–261
See application file for complete search history.

(56) References Cited

U.S. PATENT DOCUMENTS

| | | | | |
|---|---|---|---|---|
| 6,636,098 B1 * | 10/2003 | Kizer | .................... | H03F 3/4565 |
| | | | | 327/333 |
| 10,075,174 B1 * | 9/2018 | Bucossi | .................... | H03L 7/07 |
| 11,405,062 B1 * | 8/2022 | Xu | ...................... | H03F 3/45192 |

FOREIGN PATENT DOCUMENTS

| | | |
|---|---|---|
| CN | 112187198 A | 1/2021 |
| TW | 201909553 A | 3/2019 |

* cited by examiner

*Primary Examiner* — Hieu P Nguyen
(74) *Attorney, Agent, or Firm* — CKC & Partners Co., LLC

(57) ABSTRACT

A signal amplifying circuit includes an amplifier and a common mode feedback circuit. The amplifier generates first and second outputs. The common mode feedback circuit receives the first and second outputs, and controls an output common mode voltage of the first and second outputs to a first reference voltage. The common mode feedback circuit includes an output common mode voltage detection circuit, a pull-up circuit and a pull-down circuit. The output common mode voltage detection circuit generates first and second control signals according to the output common mode voltage. The pull-up circuit with a first conduction degree controlled by the first control signal controls the output common mode voltage to be positively correlated with the first conduction degree. The pull-down circuit with a second conduction degree controlled by the second control signal controls the output common mode voltage to be negatively correlated with the second conduction degree.

20 Claims, 7 Drawing Sheets

SIGNAL AMPLIFYING CIRCUIT AND SIGNAL PROCESSING SYSTEM AND ANALOG-TO-DIGITAL CONVERTING SYSTEM COMPRISING THE SAME

RELATED APPLICATIONS

This application claims priority to Taiwan Application Serial Number 111113928, filed on Apr. 12, 2022, which is herein incorporated by reference in its entirety.

BACKGROUND

Technical Field

The present disclosure relates to a signal amplifying circuit. More particularly, the present disclosure relates to a signal amplifying circuit including a common mode feedback circuit, and to a signal processing system and an analog-to-digital converting system comprising the signal amplifying circuit.

Description of Related Art

The signals inputted to the amplifier include the differential inputs and the common mode noise. The performance of the amplifier can be known by the common mode rejection ratio. The common mode rejection ratio is defined as the differential gain divided by the absolute value of the common mode gain. The higher the value of the common mode rejection ratio, the better the performance of the amplifier. The output common mode voltage of the fully differential amplifier is usually expected to be stable at the average value of the high and low operating voltages thereof, so as to maximize the swing of the differential voltage output of the amplifier. Implementing a common mode feedback circuit in the fully differential amplifier can not only stabilize the output common mode voltage of the amplifier through the common mode feedback circuit, but also efficiently reduce the common mode gain and improve the common mode rejection ratio.

SUMMARY

The disclosure provides a signal amplifying circuit including an amplifier and a common mode feedback circuit. The amplifier is configured to generate a first output and a second output. The common mode feedback circuit is configured to receive the first output and the second output, and is configured to control an output common mode voltage of the first output and the second output to be substantially identical to a first reference voltage. The common mode feedback circuit includes an output common mode voltage detection circuit, a pull-up circuit and a pull-down circuit. The output common mode voltage detection circuit is configured to generate a first control signal and a second control signal according to a value of the output common mode voltage. The pull-up circuit has a first conduction degree controlled by the first control signal, and is configured to control the output common mode voltage to be positively correlated with the first conduction degree. The pull-down circuit has a second conduction degree controlled by the second control signal, and is configured to control the output common mode voltage to be negatively correlated with the second conduction degree.

The present disclosure provides a signal processing system including an input amplifying stage, a low-pass filter and a delta-sigma modulator. The low-pass filter is configured to filter an output of the input amplifying stage. The delta-sigma modulator includes an integration stage, an adder, a quantizer and a feedback circuit. The integration stage is configured to integrate an output of the low-pass filter, and includes a plurality of stages of integrator. The adder is configured to add the output of the low-pass filter and an output of each stage of integrator. The quantizer is configured to generate a digital signal according to an output of the adder. The feedback circuit is configured to feedback the digital signal to the integration stage. One or more of the input amplifying stage, the integration stage and the adder include a signal amplifying circuit, and the signal amplifying circuit includes an amplifier and a common mode feedback circuit. The amplifier is configured to generate a first output and a second output, so as to correspondingly form the output of the input amplifying stage, the output of each stage of integrator and the output of the adder. The common mode feedback circuit is configured to receive the first output and the second output, and is configured to control an output common mode voltage of the first output and the second output to be substantially identical to a first reference voltage. The common mode feedback circuit includes an output common mode voltage detection circuit, a pull-up circuit and a pull-down circuit. The output common mode voltage detection circuit is configured to generate a first control signal and a second control signal according to a value of the output common mode voltage. The pull-up circuit has a first conduction degree controlled by the first control signal, and is configured to control the output common mode voltage to be positively correlated with the first conduction degree. The pull-down circuit has a second conduction degree controlled by the second control signal, and is configured to control the output common mode voltage to be negatively correlated with the second conduction degree.

The present disclosure provides an analog-to-digital converting system including an input amplifying stage, a low-pass filter and an analog-to-digital converter. The low-pass filter is configured to filter an output of the input amplifying stage. The analog-to-digital converter is configured to process an output of the low-pass filter to generate a digital signal. The input amplifying stage includes a signal amplifying circuit, and the signal amplifying circuit includes an amplifier and a common mode feedback circuit. The amplifier is configured to generate a first output and a second output to form the output of the input amplifying stage. The common mode feedback circuit is configured to receive the first output and the second output, and is configured to control an output common mode voltage of the first output and the second output to be substantially identical to a first reference voltage. The common mode feedback circuit includes an output common mode voltage detection circuit, a pull-up circuit and a pull-down circuit. The output common mode voltage detection circuit is configured to generate a first control signal and a second control signal according to a value of the output common mode voltage. The pull-up circuit has a first conduction degree controlled by the first control signal, and is configured to control the output common mode voltage to be positively correlated with the first conduction degree. The pull-down circuit has a second conduction degree controlled by the second control signal, and is configured to control the output common mode voltage to be negatively correlated with the second conduction degree.

It is to be understood that both the foregoing general description and the following detailed description are by examples, and are intended to provide further explanation of the disclosure as claimed.

DETAILED DESCRIPTION

Figure 1:
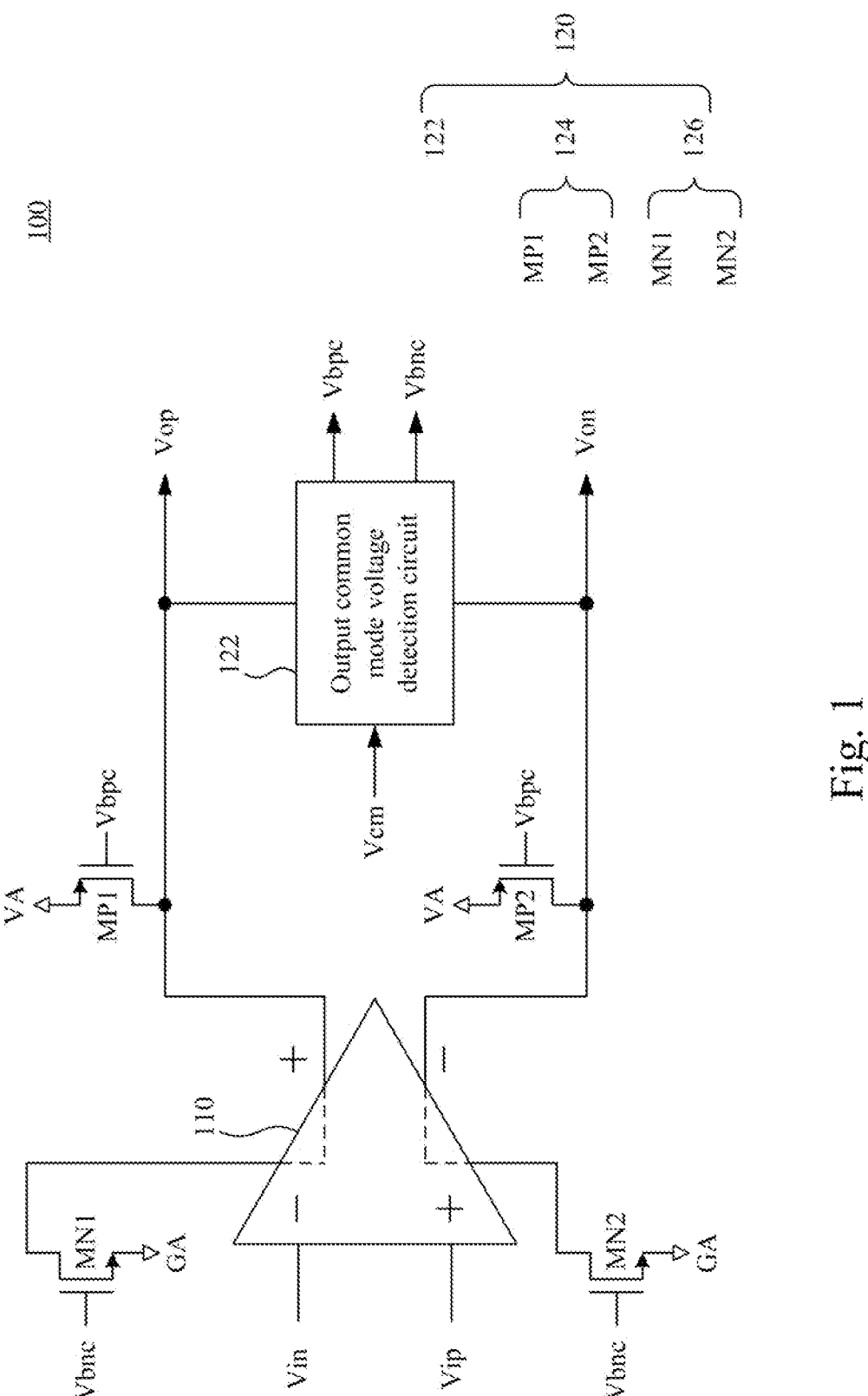
FIG. 1 is a simplified functional block diagram of a signal amplifying circuit according to one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a simplified functional block diagram of a signal amplifying circuit 100 according to one embodiment of the present disclosure. The signal amplifying circuit 100 includes an amplifier 110 and a common mode feedback (CMFB) circuit 120. The amplifier 110 includes a first input terminal (e.g., the non-inverting input terminal) and a second input terminal (e.g., the inverting input terminal), and includes a first output terminal (e.g., the non-inverting output terminal) and a second output terminal (e.g., the inverting output terminal). The first input terminal of the amplifier 110 is configured to receive a first input Vip, and the second input terminal is configured to receive a second input Vin. The amplifier 110 is configured to amplify the difference between the first input Vip and the second input Vin so as to generate a first output Vop and a second output Von respectively at the first output terminal and the second output terminal thereof.

In some embodiments, the amplifier 110 is one of following: a Class A amplifier, a Class B amplifier and a Class AB amplifier.

The CMFB circuit 120 is coupled with the first output terminal and the second output terminal of the amplifier 110, and is configured to receive the first output Vop and the second output Von. The CMFB circuit 120 is configured to control the output common mode voltage of the first output Vop and the second output Von. In some embodiments, the output common mode voltage may be defined as an average voltage of the first output Vop and the second output Von, that is, the output common mode voltage may be Vop+Von/2.

In some embodiments, the CMFB circuit 120 is configured to receive a first reference voltage Vcm. The CMFB circuit 120 controls the output common mode voltage to be substantially identical to the first reference voltage Vcm. For example, the output common mode voltage can be within the range of first reference voltage Vcm±10%, or the output common mode voltage can be within the range of first reference voltage Vcm±5%.

In some embodiments, for realizing the aforesaid control, the CMFB circuit 120 includes an output common mode voltage detection circuit 122, a pull-up circuit 124, and a pull-down circuit 126. The output common mode voltage detection circuit 122 is coupled with the first output terminal and the second output terminal of the amplifier 110, and is configured to receive the first output Vop and the second output Von. The output common mode voltage detection circuit 122 calculates the value of the output common mode voltage, and generates a first control signal Vbpc and a second control signal Vbnc according to the difference between the output common mode voltage and the first reference voltage Vcm. The pull-up circuit 124 has a first conduction degree controlled by the first control signal Vbpc, and is configured to control the output common mode voltage to be positively correlated with the first conduction degree. The pull-down circuit 126 has a second conduction degree controlled by the second control signal Vbnc, and is configured to control the output common mode voltage to be negatively correlated with the second conduction degree. For example, when the output common mode voltage is higher than the first reference voltage Vcm, the first control signal Vbpc reduces the first conduction degree of the pull-up circuit 124, and the second control signal Vbnc increases the second conduction degree of the pull-down circuit 126, so as to reduce the output common mode voltage. As another example, when the output common mode voltage is lower than the first reference voltage Vcm, the first control signal Vbpc increases the first conduction degree of the pull-up circuit 124, and the second control signal Vbnc reduces the second conduction degree of the pull-down circuit 126, so as to increase the output common mode voltage.

As shown in FIG. 1, in some embodiments, the pull-up circuit 124 includes a first pull-up transistor MP1 and a second pull-up transistor MP2. The aforementioned first conduction degree may include the conduction degree of the first pull-up transistor MP1 and the conduction degree of the second pull-up transistor MP2. The first pull-up transistor MP1 is coupled between a first power terminal VA and the first output terminal of the amplifier 110. The second pull-up transistor MP2 is coupled between the first power terminal VA and the second output terminal of the amplifier 110. In some embodiments, the pull-down circuit 126 includes a first pull-down transistor MN1 and a second pull-down transistor MN2. The aforementioned second conduction degree may include the conduction degree of the first pull-down transistor MN1 and the conduction degree of the second pull-down transistor MN2. A terminal of the first pull-down transistor MN1 is coupled with the second power terminal GA, and another terminal is directly or indirectly coupled with the first output terminal of the amplifier 110. A terminal of the second pull-down transistor MN2 is coupled with the second power terminal GA, and another terminal is directly or indirectly coupled with the second output terminal of the amplifier 110.

In some embodiments, the voltage level of the first power terminal VA is higher than that of the second power terminal GA. In some embodiments, the first power terminal VA provides a high operating voltage (e.g., 1.8 V), and the second power terminal GA provides a low operation voltage (e.g., the ground voltage).

In some embodiments, the first pull-up transistor MP1 and the second pull-up transistor MP2 are P-type transistors, and the first pull-down transistor MN1 and the second pull-down transistor MN2 are N-type transistors. When the value of the output common mode voltage is excessively high (higher than the first reference voltage Vcm), the output common mode voltage detection circuit 122 increases the voltage levels of the first control signal Vbpc and the second control signal Vbnc, so as to reduce the conduction degree of the first pull-up transistor MP1 and the second pull-up transistor MP2, and to increase the conduction degree of the first pull-down transistor MN1 and the second pull-down transistor MN2. On the other hand, when the output common mode voltage is excessively low (lower than the first reference voltage Vcm), the output common mode voltage detection circuit 122 reduces the voltage levels of the first control signal Vbpc and the second control signal Vbnc, so as to increase the conduction degree of the first pull-up transistor MP1 and the second pull-up transistor MP2, and to decrease the conduction degree of the first pull-down transistor MN1 and the second pull-down transistor MN2.

In other words, the voltage levels of the first control signal Vbpc and the second control signal Vbnc are positively correlated with the value of the output common mode voltage. The voltage level of the first control signal Vbpc and the voltage level of the second control signal Vbnc are positively correlated with each other.

Figure 2:
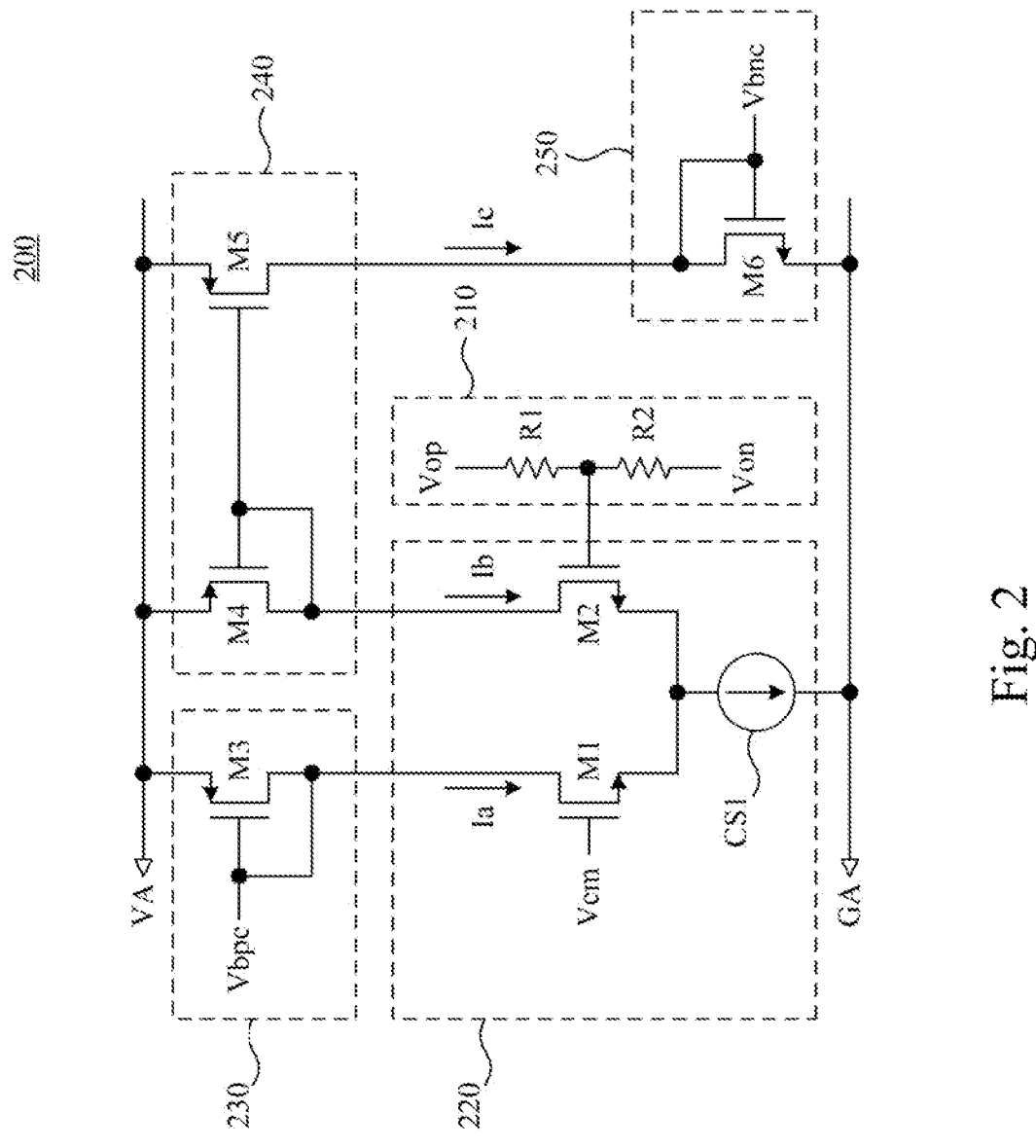
FIG. 2 is a circuit schematic diagram of an output common mode voltage detection circuit according to one embodiment of the present disclosure.

FIG. 2 is a circuit schematic diagram of an output common mode voltage detection circuit 200 according to one embodiment of the present disclosure. The output common mode voltage detection circuit 200 may be used to realize the output common mode voltage detection circuit 122 of FIG. 1, and includes a voltage-averaging circuit 210, a differential input pair 220, a first loading circuit 230, a current mirror circuit 240 and a second loading circuit 250. The voltage-averaging circuit 210 is configured to receive the first output Vop and the second output Von, and is configured to average the first output Vop and the second output Von to extract the output common mode voltage. The differential input pair 220 includes a first input terminal and a second input terminal, and the first input terminal and the second input terminal thereof are configured to receive the first reference voltage Vcm and the output common mode voltage, respectively. According to the first reference voltage Vcm and the output common mode voltage, the differential input pair 220 generates a first current Ia at the side of the first input terminal, and generates a second current Ib at the side of the second input terminal.

The first loading circuit 230 is coupled with the differential input pair 220 to generate the first control signal Vbpc according to the first current Ia, such as converting the first current Ia into the first control signal Vbpc that is a voltage signal. The current mirror circuit 240 is coupled with the differential input pair 220 to generate a third current Ic according to the second current Ib. The second loading circuit 250 is coupled with the current mirror circuit 240 to generate the second control signal Vbnc according to the third current Ic, such as converting the third current Ic into the second control signal Vbnc that is a voltage signal.

In some embodiments, the voltage-averaging circuit 210 includes a first resistor R1 and a second resistor R2 that are coupled in series. A terminal of the first resistor R1 is configured to receive the first output Vop, and another terminal is coupled with the second resistor R2. A terminal of the second resistor R2 is configured to receive the second output Von, and another terminal is coupled with the first resistor R1. A node between the first resistor R1 and the second resistor R2 is configured to provide the output common mode voltage to the second input terminal of the differential input pair 220.

In some embodiments, the differential input pair 220 includes a transistor M1, a transistor M2 and a current source CS1. The transistor M1 is coupled between the first loading circuit 230 and the current source CS1, and a control terminal of the transistor M1 is operated as the first input terminal of the differential input pair 220. The transistor M2 is coupled between the current mirror circuit 240 and the current source CS1, and a control terminal of the transistor M2 is operated as the second input terminal of the differential input pair 220.

In some embodiments, the first loading circuit 230 includes a transistor M3. A first terminal of the transistor M3 is coupled with the first power terminal VA, and a second terminal of the transistor M3 is configured to receive the first current Ia from the differential input pair 220. A control terminal and the second terminal of the transistor M3 are coupled with each other, so that the control terminal of the transistor M3 generates the first control signal Vbpc.

In some embodiments, the current mirror circuit 240 includes a transistor M4 and a transistor M5. The first terminal of the transistor M4 is coupled with the first power terminal VA, and the second terminal of the transistor M4 is configured to receive the second current Ib from the differential input pair 220, in which a control terminal and the second terminal of the transistor M4 are coupled with each other. The first terminal of the transistor M5 is coupled with the first power terminal VA, and the second terminal of the transistor M5 is configured to provide the third current Ic to the second loading circuit 250. The control terminal of the transistor M4 is coupled with the control terminal of the transistor M5.

In some embodiments, the second loading circuit 250 includes a transistor M6. The first terminal of the transistor M6 is configured to receive the third current Ic from the current mirror circuit 240, and the second terminal of the transistor M6 is coupled with the second power terminal GA. The control terminal and the first terminal of the transistor M6 are coupled with each other, so that the control terminal of the transistor M6 generates the second control signal Vbnc.

Figure 3:
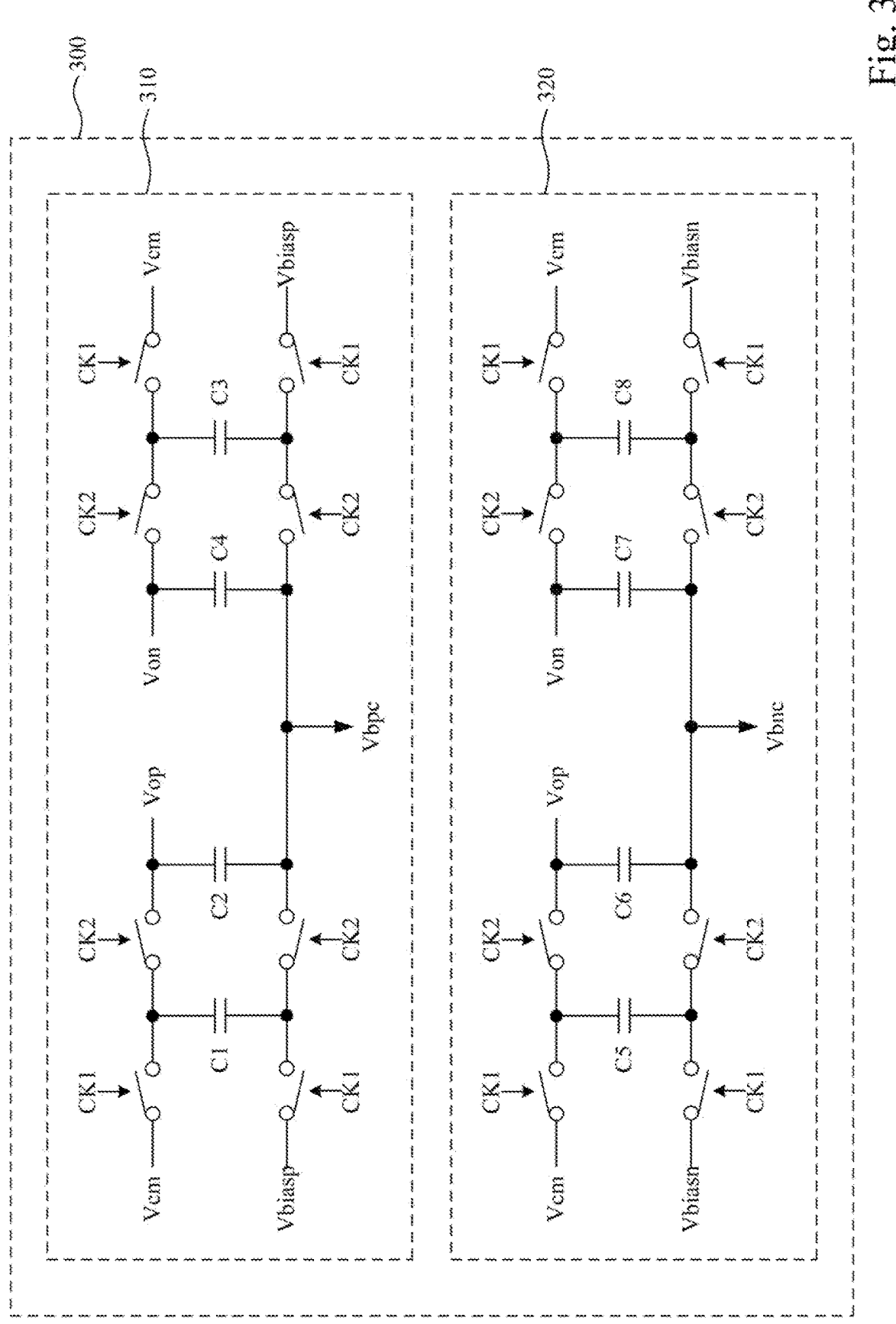
FIG. 3 is a circuit schematic diagram of an output common mode voltage detection circuit according to one embodiment of the present disclosure.

FIG. 3 is a circuit schematic diagram of an output common mode voltage detection circuit 300 according to one embodiment of the present disclosure. The output common mode voltage detection circuit 300 can be used to realize the output common mode voltage detection circuit 122 of FIG. 1, and includes a first switch-capacitor circuit 310 and a second switch-capacitor circuit 320. The first switch-capacitor circuit 310 is configured to receive the first output Vop, the second output Von, the first reference voltage Vcm and a second reference voltage Vbiasp to generate the first control signal Vbpc. The second switch-capacitor circuit 320 is configured to receive the first output Vop, the second output Von, the first reference voltage Vcm and a third reference voltage Vbiasn to generate the second control signal Vbnc. In some embodiments, the second reference voltage Vbiasp is higher than the third reference voltage Vbiasn.

The first switch-capacitor circuit 310 includes capacitors C1-C4 and a plurality of switches. The capacitors C1 and C2 are coupled in parallel through some of the switches, and the capacitors C3 and C4 are coupled in parallel through other switches. The switches are controlled by a first clock signal CK1 and a second clock signal CK2 that are non-overlapping with each other. First, the switches controlled by the first clock signal CK1 are conducted, while the switches controlled by the second clock signal CK2 are switched-off. The first reference voltage Vcm and the second reference voltage Vbiasp are transmitted to two terminals of the capacitor C1 and two terminals of the capacitor C3. The first output Vop is transmitted to a first terminal of the capacitor C2, and the second output Von is transmitted to a first terminal of the capacitor C4. Then, the switches controlled by the first clock signal CK1 are switched-off, and the switches controlled by the second clock signal CK2 are conducted, so that the capacitors C1 and C2 are conducted to each other to form a parallel connection, and the capacitors C3 and C4 are conducted to each other to form another parallel connection. Therefore, the first control signal Vbpc generated by a second terminal of the capacitor C2 and a second terminal of the capacitor C4 can be represented by $$\frac{V_{on} + V_{op}}{2} - V_{cm} + V\ bias\ p.$$

The second switch-capacitor circuit 320 includes capacitors C5-C8 and a plurality of switches. The capacitors C5 and C6 are coupled in parallel through some switches, and the capacitors C7 and C8 are coupled in parallel through other switches. The second switch-capacitor circuit 320 has components, connection relationships and operations similar to those of the first switch-capacitor circuit 310. That is, the first switch-capacitor circuit 310 has a first circuit topology, and the second switch-capacitor circuit 320 has a second circuit topology, in which the first circuit topology is substantially identical to the second circuit topology. The second control signal Vbnc can be represented by $$\frac{V_{on} + V_{op}}{2} - V_{cm} + V\ bias\ n.$$

Figure 4:
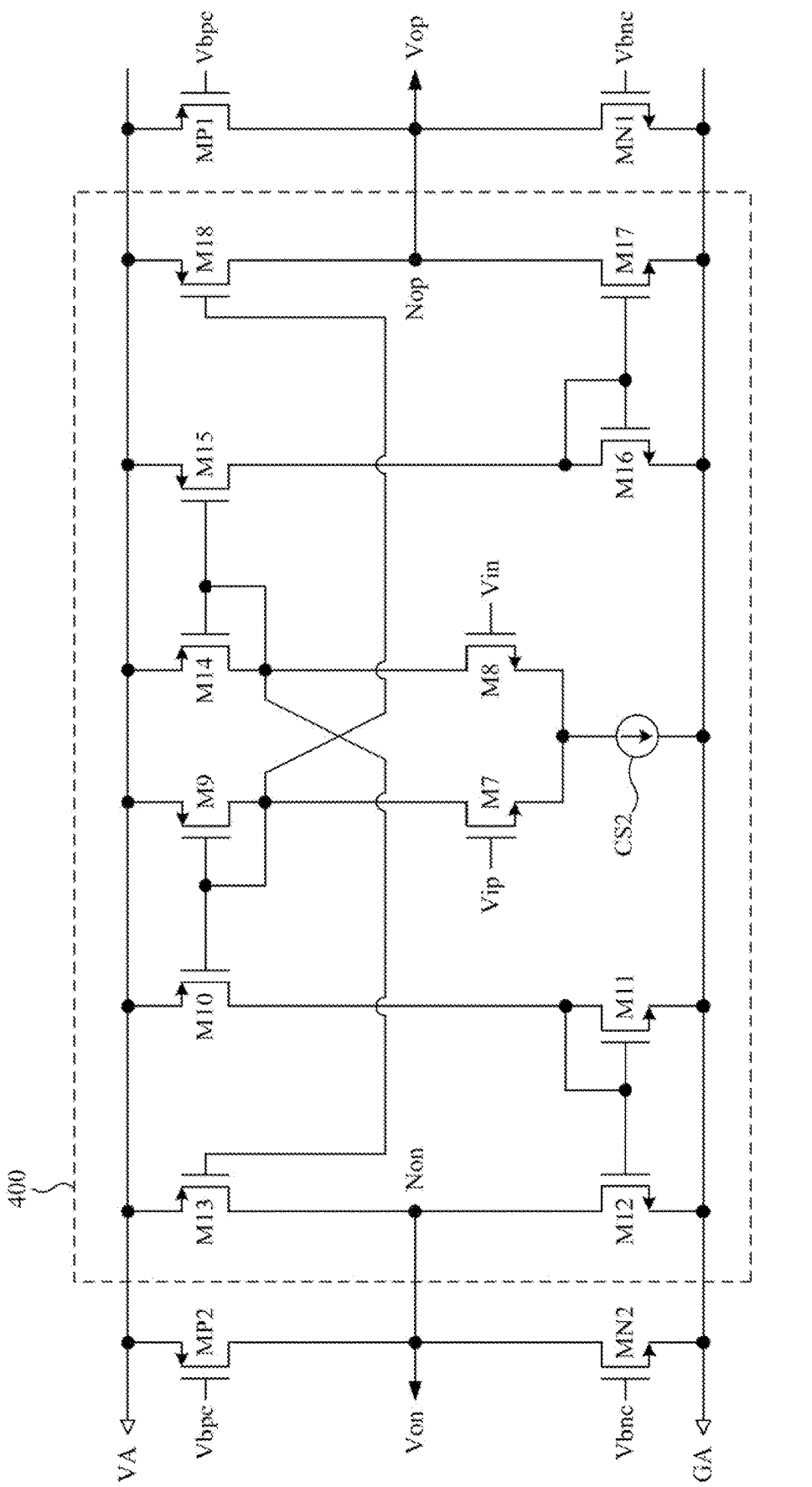
FIG. 4 is a circuit schematic diagram of an amplifier according to one embodiment of the present disclosure.

FIG. 4 is a circuit schematic diagram of an amplifier 400 according to one embodiment of the present disclosure. The amplifier 400 is the Class AB amplifier that can be used to realize the amplifier 110 of FIG. 1. The following paragraphs will describe the embodiments in which the CMFB circuit 120 is applied to the Class AB amplifier, with reference to FIG. 1 and FIG. 4.

The amplifier 400 is configured to receive the operating voltages from the first power terminal VA and the second power terminal GA, and is configured to amplify the difference between the first input Vip and the second input Vin to generate the first output Vop and the second output Von. The amplifier 400 includes a differential input pair, a plurality of current mirror circuits, a non-inverting output stage and an inverting output stage. The differential input pair includes a transistor M7, a transistor M8 and a current source CS2. A control terminal of the transistor M7 is configured to receive the first input Vip. A control terminal of the transistor M8 is configured to receive the second input Vin. The current mirror circuits are respectively formed by (1) a combination of transistors M9, M10 and M18, (2) a combination of transistors M11 and M12, (3) a combination of transistors M13, M14 and M15 and (4) a combination of transistors M16 and M17. The non-inverting output stage includes the transistors M18 and M17. The inverting output stage includes the transistors M12 and M13.

A partial circuit of the amplifier 400 that generates the first output Vop includes the following structures: the transistors M8 and M14 coupled in series; the transistors M15 and M16 coupled in series; the transistors M17 and M18 coupled in series; and the control terminal of the transistor M18 coupled between the transistors M7 and M9. Therefore, a first output terminal (e.g., the non-inverting output terminal) Nop between the transistors M17 and M18 generates the first output Vop.

A partial circuit of the amplifier 400 that generates the second output Von includes the following structures: the transistors M7 and M9 coupled in series; the transistors M10 and M11 coupled in series; the transistors M12 and M13 coupled in series; and the control terminal of the transistor M13 coupled between the transistors M8 and M14. Therefore, a second output terminal (e.g., the inverting output terminal) Non between the transistors M12 and M13 generates the second output Von.

As can be known from FIG. 4, in the embodiment in which the CMFB circuit 120 of FIG. 1 is applied to the Class AB amplifier 400, the pull-up circuit 124 is coupled with the pull-down circuit 126 in series through the first output terminal Nop and the second output terminal Non. In specific, the first pull-up transistor MP1 is coupled with the first pull-down transistor MN1 in series through the first output terminal Nop, and the second pull-up transistor MP2 is coupled with the second pull-down transistor MN2 in series through the second output terminal Non.

In some embodiments, the CMFB circuit 120 of FIG. 1 can be applied to the Class B amplifier, that is, the amplifier 110 of FIG. 1 may be the Class B amplifier. A person having ordinary skill in the art will appreciate that the Class B amplifier and the Class AB amplifier have output stages with similar structures. For example, the Class B amplifier may have the first output terminal Nop to provide the first output Vop, and may have the second output terminal Non to provide the second output Von. In the embodiments that pertain to the Class B amplifier, the pull-up circuit 124 is coupled with the pull-down circuit 126 in series through the first output terminal Nop and the second output terminal Non. In specific, the first pull-up transistor MP1 is coupled with the first pull-down transistor MN1 in series through the first output terminal Nop, and the second pull-up transistor MP2 is coupled with the second pull-down transistor MN2 in series through the second output terminal Non.

Figure 5:
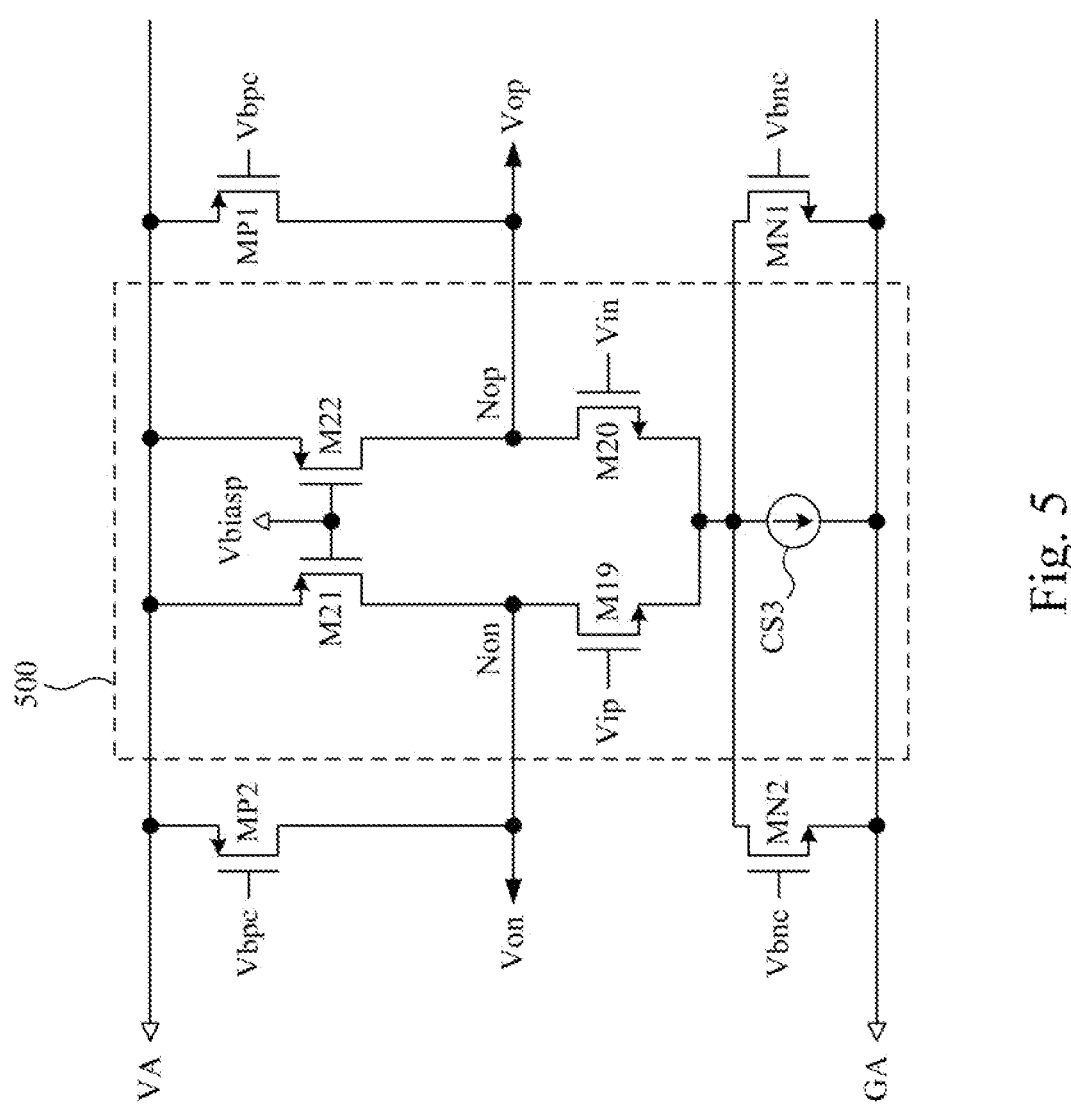
FIG. 5 is a circuit schematic diagram of an amplifier according to one embodiment of the present disclosure.

FIG. 5 is a circuit schematic diagram of an amplifier 500 according to one embodiment of the present disclosure. The amplifier 500 is the Class A amplifier that can be used to realize the amplifier 110 of FIG. 1. The following paragraphs will describe the embodiments in which the CMFB circuit 120 is applied to the Class A amplifier, with reference to FIG. 1 and FIG. 5.

The amplifier 500 is configured to receive the operating voltages from the first power terminal VA and the second power terminal GA, and is configured to amplify the difference between the first input Vip and the second input Vin to generate the first output Vop and the second output Von. The amplifier 500 includes the transistors M19-M22 and the current source CS3, in which the transistor M19, the transistor M20 and the current source CS3 form a differential input pair. A control terminal of the transistor M19 is configured to receive the first input Vip. A control terminal of the transistor M20 is configured to receive the second input Vin. The transistor M22 is coupled with the transistor M20 in series. A first output terminal (e.g., the non-inverting output terminal) Nop of the amplifier 500 is between the transistors M20 and M22, and is configured to generate the first output Vop. The transistor M21 is coupled with the transistor M19 in series. A second output terminal (e.g., the inverting output terminal) Non of the amplifier 500 is between the transistors M19 and M21, and is configured to generate the second output Von. The transistors M21 and M22 have control terminals configured to receive the second reference voltage Vbiasp, but this disclosure is not limited thereto.

As can be known from FIG. 5, in the embodiments in which the CMFB circuit 120 of FIG. 1 is applied to the Class A amplifier 500, the pull-up circuit 124 is coupled with the first output terminal Nop and the second output terminal Non, while the pull-down circuit 126 is coupled in parallel with the current source CS3 of the differential input pair. In specific, the first pull-up transistor MP1 is coupled with the first output terminal Nop, and the second pull-up transistor MP2 is coupled with the second output terminal Non. A first terminal of the current source CS3 is coupled with the transistors M19 and M20, and the second terminal of the current source CS3 is coupled with the second power terminal GA. The first pull-down transistor MN1 is coupled between the first terminal of the current source CS3 and the second power terminal GA. The second pull-down transistor MN2 is also coupled between the first terminal of the current source CS3 and the second power terminal GA.

In some embodiments, the CMFB circuit includes only the pull-up transistors, to ensure the control capability of such CMFB circuit to the output common mode voltage, the pull-up transistors of such CMFB circuit needs a large size (width-to-length ratio), but such design may affect the driving capability of the amplifier under the consideration of power saving, which will be described as follows. In an amplifier circuit design that does not contain the CMFB circuit, the pull-up transistors and the pull-down transistors of the non-inverting output terminal of the amplifier both have the width-to-length ratio of 100, and so does the inverting output terminal of the amplifier. If the CMFB circuit with only the pull-up transistors is applied to such amplifier circuit design, when the pull-up transistors of the CMFB circuit has the width-to-length ratio of 50, the pull-up transistors and the pull-down transistors of the non-inverting output terminal of the amplifier respectively require the width-to-length ratios of 50 and 100, and so does the inverting output terminal of the amplifier, in order to maintain the output current to be essentially identical to that before the CMFB circuit is applied to prevent additional power consumption. However, the above design may excessively reduce the size of the pull-up transistors of the amplifier, causing insufficient pull-up capability of the amplifier.

The CMFB circuit 120 of FIG. 1, by contrast, uses the pull-up transistors MP1-MP2 and pull-down transistors MN1-MN2 to cooperatively control the output common mode voltage, instead of using only the pull-up transistors MP1-MP2 or only the pull-down transistors MN1-MN2 to control. As such, the sizes (width-to-length ration) of the pull-up transistors MP1-MP2 and the pull-down transistors MN1-MN2 may be designed to be smaller, such as 25 for all of the pull-up and pull-down transistors. Therefore, when the CMFB circuit 120 is applied to the amplifier, the amplifier can have sufficient pull-up and pull-down capability under the situation that the output current is to be maintained essentially identical to that before the CMFB circuit is applied. In some embodiments, referring to FIG. 4, the transistors M12-M13 and M17-18 may each have a width-to-length ratio of 75, and the pull-up transistors MP1-MP2 and the pull-down transistors MN1-MN2 may each have a width ratio of 25.

Figure 6:
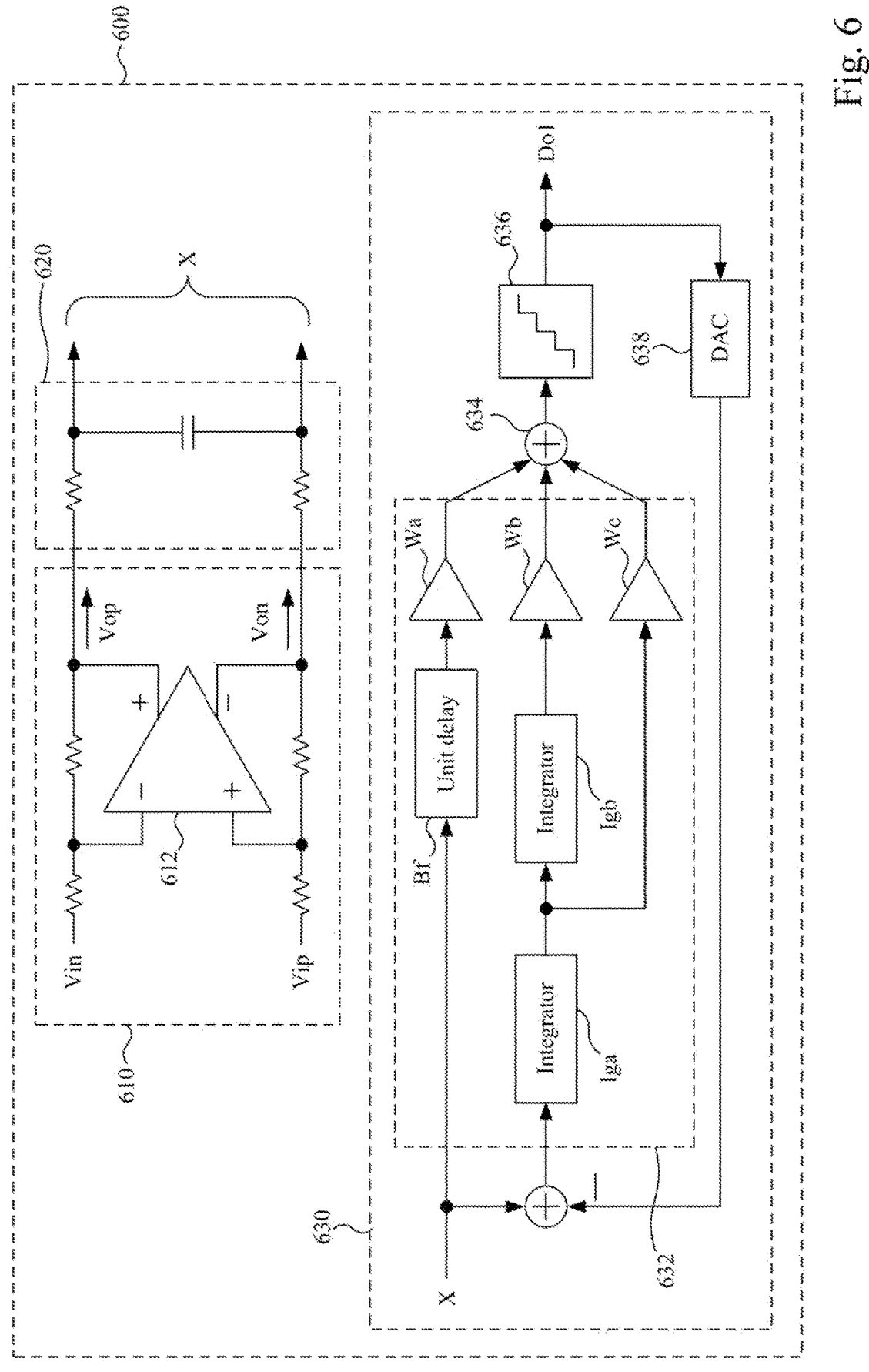
FIG. 6 is a simplified functional block diagram of a signal processing system according to one embodiment of the present disclosure.

FIG. 6 is a simplified functional block diagram of a signal processing system 600 according to one embodiment of the present disclosure. The signal processing system 600 includes an input amplifying stage 610, a low-pass filter 620 and a delta-sigma modulator 630. The input amplifying stage 610 includes a signal amplifying circuit 612 and a plurality of feedback resistors. In some embodiments, the signal amplifying circuit 612 may be implemented by the signal amplifying circuit 100 of FIG. 1. The input amplifying stage 610 is configured to generate the first output Vop and the second output Von, according to the first input Vip and the second input Vin. In some embodiments, the first input Vip and the second input Vin may be audio signals generated by a microphone receiving the sound. The low-pass filter 620 is configured to filter outputs of the input amplifying stage 610 (i.e., the first output Vop and the second output Von). In some embodiments, the low-pass filter 620 may be implemented by a resistor-capacitor low-pass filter. For the sake of brevity, a reference sign "X" is used in FIG. 6 to represent the differential output of the low-pass filter 620.

The delta-sigma modulator 630 includes an integration stage 632, an adder 634, a quantizer 636 and a feedback circuit 638. The integration stage 632 includes a plurality of stages of integrators Iga-Igb, a unit delay Bf and a plurality of weighting units Wa-Wc. The plurality of stages of integrators Iga-Igb are configured to integrate the difference between the output X of the low-pass filter 620 and the output of the feedback circuit 638. The output X of the low-pass filter 620 also passes through the unit delay Bf. Then, the adder 634 adds the output X of the low-pass filter 620 and the integration result of each stage of the integrators Iga-Igb (that are applied specific weights by the weighting units Wa-Wc). The quantizer 636 is configured to generate a first digital signal Do1, according to the output of the adder 634. The feedback circuit 638 is configured to feedback the first digital signal Do1 to the integration stage 632. In some embodiments, the feedback circuit 638 may be implemented by the digital-to-analog converter (DAC).

In some embodiments, one or more of the input amplifying stage 610, the integration stage 632 and the adder 634 include the signal amplifying circuit 100 of FIG. 1. For example, the fully differential amplifier in each stage of the integrators Iga-Igb can be implemented by the signal amplifying circuit 100. The fully differential amplifier of the adder 634 can be implemented by the signal amplifying circuit 100. The differential output generated by the signal amplifying circuit 100 may correspondingly form the output of the input amplifying stage 610, the output of each stage of integrators Iga-Igb or the output of the adder 634.

Figure 7:
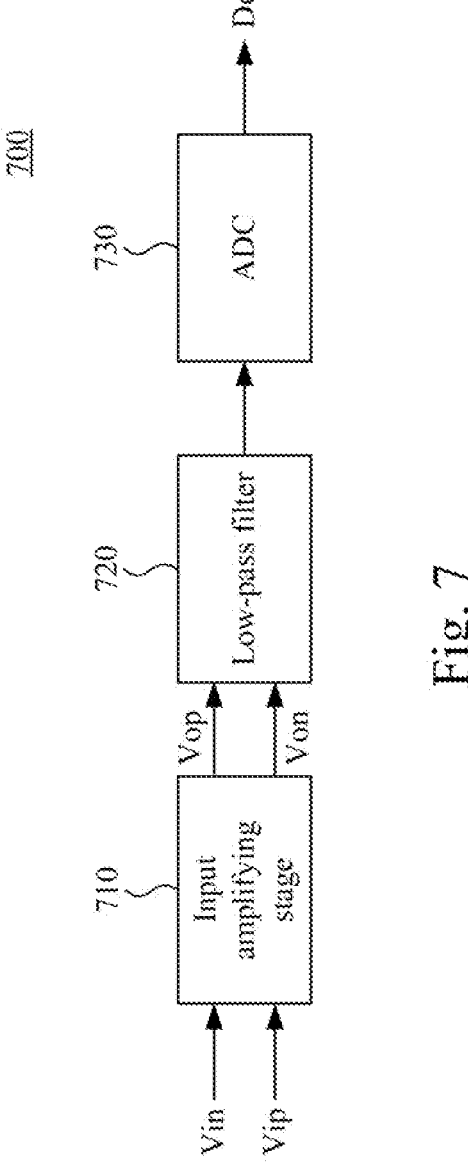
FIG. 7 is a simplified functional block diagram of an analog-to-digital converting system according to one embodiment of the present disclosure.

FIG. 7 is a simplified functional block diagram of an analog-to-digital converting system 700 according to one embodiment of the present disclosure. The analog-to-digital converting system 700 includes an input amplifying stage 710, a low-pass filter 720 and an analog-to-digital convertor (ADC) 730. The input amplifying stage 710 is similar to the input amplifying stage 610 of FIG. 6, that is, the input amplifying stage 710 includes the signal amplifying circuit 100 of FIG. 1 and a plurality of feedback resistors. The input amplifying stage 710 is configured to generate the first output Vop and the second output Von, according to the first input Vip and the second input Vin. In some embodiments, the first input Vip and the second input Vin may be audio signals generated by the microphone receiving the sound. The low-pass filter 720 is configured to filter the output of the input amplifying stage 710 (i.e., the first output Vop and the second output Von). In some embodiments, the low-pass filter 720 may be implemented by the resistor-capacitor low-pass filter. The ADC 730 is configured to process the filtered first output Vop and the filtered second output Von outputted by the low-pass filter 720, so as to generate the second digital signal Do2.

Certain terms are used in the specification and the claims to refer to specific components. However, those with ordinary skill in the art would understand that the same components may be referred to by different terms. The specification and claims do not use the differences in terms as a way to distinguish components, but the differences in functions of the components are used as a basis for distinguishing. Furthermore, it should be understood that the term "comprising" used in the specification and claims is open-ended, that is, including but not limited to. In addition, "coupling" herein includes any direct and indirect connection means. Therefore, if it is described that the first component is coupled to the second component, it means that the first component can be directly connected to the second component through electrical connection or signal connections including wireless transmission, optical transmission, and the like, or the first component is indirectly electrically or signally connected to the second component through other component(s) or connection means.

It will be understood that, in the description herein and throughout the claims that follow, the phrase "and/or" includes any and all combinations of one or more of the associated listed items. Unless the context clearly dictates otherwise, the singular terms used herein include plural referents.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A signal amplifying circuit, comprising:
an amplifier, configured to generate a first output and a second output; and
a common mode feedback circuit, configured to receive the first output and the second output, configured to control an output common mode voltage of the first output and the second output to be substantially identical to a first reference voltage, and comprising:
an output common mode voltage detection circuit, configured to generate a first control signal and a second control signal according to a value of the output common mode voltage;
a pull-up circuit with a first conduction degree controlled by the first control signal, and configured to control the output common mode voltage to be positively correlated with the first conduction degree; and
a pull-down circuit with a second conduction degree controlled by the second control signal, and configured to control the output common mode voltage to be negatively correlated with the second conduction degree.

2. The signal amplifying circuit of claim 1, wherein the pull-up circuit comprises a first pull-up transistor and a second pull-up transistor, wherein the first pull-up transistor and the second pull-up transistor are coupled between the amplifier and a first power terminal,
wherein the pull-down circuit comprises a first pull-down transistor and a second pull-down transistor,
wherein the first pull-down transistor and the second pull-down transistor are coupled between the amplifier and a second power terminal.

3. The signal amplifying circuit of claim 1, wherein a voltage level of the first control signal and a voltage level of the second control signal are positively correlated with the value of the output common mode voltage.

4. The signal amplifying circuit of claim 1, wherein the output common mode voltage detection circuit comprises:
a voltage-averaging circuit, configured to average voltages of the first output and the second output to generate the output common mode voltage;
a differential input pair, configured to generate a first current and a second current according to the first reference voltage and the output common mode voltage;
a first loading circuit, configured to generate the first control signal according to the first current;
a current mirror circuit, configured to generate a third current according to the second current; and
a second loading circuit, configured to generate the second control signal according to the third current.

5. The signal amplifying circuit of claim 4, wherein the voltage-averaging circuit comprises:
a first resistor, configured to receive the first output; and
a second resistor, configured to receive the second output, wherein the first resistor coupled with the second resistor in series to average the voltages of the first output and the second output to generate the output common mode voltage.

6. The signal amplifying circuit of claim 1, wherein the output common mode voltage detection circuit comprises:
a first switch-capacitor circuit, configured to generate the first control signal according to the first output, the second output, the first reference voltage and a second reference voltage; and
a second switch-capacitor circuit, configured to generate the second control signal according to the first output, the second output, the first reference voltage and a third reference voltage.

7. The signal amplifying circuit of claim 6, wherein the first switch-capacitor circuit has a first circuit topology, the second switch-capacitor circuit has a second circuit topology, wherein the first circuit topology is substantially identical to the second circuit topology.

8. The signal amplifying circuit of claim 1, wherein the amplifier is a Class B amplifier or a Class AB amplifier,
wherein the amplifier comprises a first output terminal and a second output terminal, wherein the first output terminal and the second output terminal are configured to output the first output and the second output, respectively,
wherein the pull-up circuit is coupled with the pull-down circuit in series through the first output terminal and the second output terminal.

9. The signal amplifying circuit of claim 1, wherein the amplifier is a Class A amplifier,
wherein the amplifier comprises a first output terminal, a second output terminal and a differential input pair, the first output terminal and the second output terminal are configured to output the first output and the second output, respectively, wherein the pull-up circuit is coupled with the first output terminal and the second output terminal, and the pull-down circuit is coupled with a current source of the differential input pair in parallel.

10. A signal processing system, comprising:
an input amplifying stage;
a low-pass filter, configured to filter an output of the input amplifying stage; and
a delta-sigma modulator, comprising:
an integration stage, configured to integrate an output of the low-pass filter, and comprising a plurality of stages of integrator;
an adder, configured to add the output of the low-pass filter and an output of each stage of integrator;
a quantizer, configured to generate a digital signal according to an output of the adder; and
a feedback circuit, configured to feedback the digital signal to the integration stage,
wherein one or more of the input amplifying stage, the integration stage and the adder comprise a signal amplifying circuit, and the signal amplifying circuit comprises:
an amplifier, configured to generate a first output and a second output, so as to correspondingly form the output of the input amplifying stage, the output of each stage of integrator and the output of the adder; and
a common mode feedback circuit, configured to receive the first output and the second output, configured to control an output common mode voltage of the first output and the second output to be substantially identical to a first reference voltage, and comprising:
an output common mode voltage detection circuit, configured to generate a first control signal and a second control signal according to a value of the output common mode voltage;
a pull-up circuit with a first conduction degree controlled by the first control signal, configured to control the output common mode voltage to be positively correlated with the first conduction degree; and
a pull-down circuit with a second conduction degree controlled by the second control signal, configured to control the output common mode voltage to be negatively correlated with the second conduction degree.

11. The signal processing system of claim 10, wherein the pull-up circuit comprises a first pull-up transistor and a second pull-up transistor,
wherein the first pull-up transistor and the second pull-up transistor are coupled between the amplifier and a first power terminal,
wherein the pull-down circuit comprises a first pull-down transistor and a second pull-down transistor,
wherein the first pull-down transistor and the second pull-down transistor are coupled between the amplifier and a second power terminal.

12. The signal processing system of claim 10, wherein a voltage level of the first control signal and a voltage level of the second control signal are positively correlated with the value of the output common mode voltage.

13. The signal processing system of claim 10, wherein the output common mode voltage detection circuit comprises:
a voltage-averaging circuit, configured to average voltages of the first output and the second output to generate the output common mode voltage;
a differential input pair, configured to generate a first current and a second current according to the first reference voltage and the output common mode voltage;

a first loading circuit, configured to generate the first control signal according to the first current;
a current mirror circuit, configured to generate a third current according to the second current; and
a second loading circuit, configured to generate the second control signal according to the third current.

14. The signal processing system of claim 13, wherein the voltage-averaging circuit comprises:
a first resistor, configured to receive the first output; and
a second resistor, configured to receive the second output, wherein the first resistor is coupled with the second resistor in series to average the voltages of the first output and the second output to generate the output common mode voltage.

15. The signal processing system of claim 10, wherein the output common mode voltage detection circuit comprises:
a first switch-capacitor circuit, configured to generate the first control signal according to the first output, the second output, the first reference voltage and a second reference voltage; and
a second switch-capacitor circuit, configured to generate the second control signal according to the first output, the second output, the first reference voltage and a third reference voltage.

16. The signal processing system of claim 15, wherein the first switch-capacitor circuit has a first circuit topology, the second switch-capacitor circuit has a second circuit topology, wherein the first circuit topology is substantially identical to the second circuit topology.

17. The signal processing system of claim 10, wherein the amplifier is a Class B amplifier or a Class AB amplifier,
wherein the amplifier comprises a first output terminal and a second output terminal, and the first output terminal and the second output terminal are configured to output the first output and the second output, respectively,
wherein the pull-up circuit is coupled with the pull-down circuit in series through the first output terminal and the second output terminal.

18. The signal processing system of claim 10, wherein the amplifier is a Class A amplifier,
wherein the amplifier comprises a first output terminal, a second output terminal and a differential input pair, and the first output terminal and the second output terminal are configured to output the first output and the second output, respectively,
wherein the pull-up circuit is coupled with the first output terminal and the second output terminal, and the pull-down circuit is coupled with a current source of the differential input pair in series.

19. An analog-to-digital converting system, comprising:
an input amplifying stage;
a low-pass filter, configured to filter an output of the input amplifying stage; and
an analog-to-digital converter, configured to process an output of the low-pass filter to generate a digital signal,
wherein the input amplifying stage comprises a signal amplifying circuit, and the signal amplifying circuit comprises:
an amplifier, configured to generate a first output and a second output to form the output of the input amplifying stage; and
a common mode feedback circuit, configured to receive the first output and the second output, configured to control an output common mode voltage of the first output and the second output to be substantially identical to a first reference voltage, and comprising:

an output common mode voltage detection circuit, configured to generate a first control signal and a second control signal according to a value of the output common mode voltage;

a pull-up circuit with a first conduction degree controlled by the first control signal, and configured to control the output common mode voltage to be positively correlated with the first conduction degree; and a pull-down circuit with a second conduction degree controlled by the second control signal, and configured to control the output common mode voltage to be negatively correlated with the second conduction degree.

20. The analog-to-digital converting system of claim 19, wherein the pull-up circuit comprises a first pull-up transistor and a second pull-up transistor, wherein the first pull-up transistor and the second pull-up transistor are coupled between the amplifier and a first power terminal, wherein the pull-down circuit comprises a first pull-down transistor and a second pull-down transistor, wherein the first pull-down transistor and the second pull-down transistor are coupled between the amplifier and a second power terminal.

\* \* \* \* \*